(12) United States Patent
Pagaila

(10) Patent No.: US 8,861,221 B2
(45) Date of Patent: Oct. 14, 2014

(54) INTEGRATED CIRCUIT PACKAGING SYSTEM WITH A SHIELD AND METHOD OF MANUFACTURE THEREOF

(75) Inventor: Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 375 days.

(21) Appl. No.: 12/890,371

(22) Filed: Sep. 24, 2010

(65) Prior Publication Data

US 2012/0075821 A1 Mar. 29, 2012

(51) Int. Cl.
*H05K 7/00* (2006.01)
*H05K 1/02* (2006.01)
*H01L 23/552* (2006.01)
*H01L 23/367* (2006.01)
*H01L 23/31* (2006.01)
*H01L 25/03* (2006.01)
*H01L 21/56* (2006.01)
*H01L 25/065* (2006.01)
*H05K 3/28* (2006.01)

(52) U.S. Cl.
CPC .... *H05K 1/0224* (2013.01); *H01L 2924/15311* (2013.01); *H01L 21/563* (2013.01); *H05K 2201/09618* (2013.01); *H01L 2224/48227* (2013.01); *H01L 2224/16225* (2013.01); *H01L 23/552* (2013.01); *H01L 2224/73253* (2013.01); *H01L 2225/1023* (2013.01); *H01L 23/3677* (2013.01); *H01L 2224/73265* (2013.01); *H01L 25/0657* (2013.01); *H05K 3/284* (2013.01); *H01L 2224/32245* (2013.01); *H01L 23/3157* (2013.01); *H05K 2203/1316* (2013.01); *H01L 2225/1058* (2013.01); *H01L 25/03* (2013.01); *H01L 2224/32225* (2013.01)
USPC .......................................... 361/783; 361/816

(58) Field of Classification Search
CPC ................. H01L 23/58; H01L 2224/48227; H01L 2224/73265; H01L 2224/32225; H01L 2224/32245; H01L 2924/00; H01L 2924/15311; H01L 21/563; H01L 2224/16225; H01L 2224/73253; H01L 2225/1023; H01L 2225/1058; H01L 23/3157; H05K 1/0224; H05K 3/284; H05K 2201/09618; H05K 2203/1316
USPC ................. 361/728, 736, 796, 800, 816, 818; 174/350, 353, 362, 377, 379, 391
See application file for complete search history.

(56) References Cited

U.S. PATENT DOCUMENTS

| | | | | |
|---|---|---|---|---|
| 6,020,637 A * | 2/2000 | Karnezos | | 257/738 |
| 7,034,386 B2 * | 4/2006 | Kurita | | 257/685 |
| 7,217,993 B2 | 5/2007 | Nishimura | | |
| 7,261,596 B2 * | 8/2007 | Akaike et al. | | 439/607.01 |
| 7,537,962 B2 | 5/2009 | Jang et al. | | |
| 7,629,674 B1 * | 12/2009 | Foster | | 257/659 |
| 2003/0102552 A1 * | 6/2003 | Martin et al. | | 257/704 |
| 2007/0235215 A1 | 10/2007 | Bathan et al. | | |
| 2009/0256244 A1 * | 10/2009 | Liao et al. | | 257/660 |
| 2010/0133665 A1 | 6/2010 | Ha et al. | | |

FOREIGN PATENT DOCUMENTS

JP 2002026178 * 1/2002

OTHER PUBLICATIONS

U.S. Appl. No. 12/711,250, filed Feb. 23, 2010, Chi et al.
U.S. Appl. No. 12/434,367, filed May 1, 2009, Chi et al.

* cited by examiner

*Primary Examiner* — Yuriy Semenenko
(74) *Attorney, Agent, or Firm* — Ishimaru & Associates LLP

(57) ABSTRACT

A method of manufacture of an integrated circuit packaging system includes: providing a substrate; mounting a first integrated circuit over the substrate; forming an encapsulant around the first integrated circuit and over the substrate; and forming a shield structure within and over the encapsulant while simultaneously forming a vertical interconnect structure.

20 Claims, 5 Drawing Sheets

INTEGRATED CIRCUIT PACKAGING SYSTEM WITH A SHIELD AND METHOD OF MANUFACTURE THEREOF

TECHNICAL FIELD

The present invention relates generally to an integrated circuit packaging system, and more particularly to an integrated circuit packaging system with a shield.

BACKGROUND ART

Integrated circuits find application in many of today's consumer electronics, such as cell phones, video cameras, portable music players, printers, computers, etc. Integrated circuits may include a combination of active devices, passive devices and their interconnections.

Under normal operation, integrated circuits typically generate undesirable electromagnetic energy that can interfere with the operation of proximately located integrated circuits. Generally, this undesirable electromagnetic energy can be referred to as electromagnetic interference (EMI). Unfortunately, as modern consumer electronics continue to shrink and operate at continually increasing frequencies, the frequency of these electromagnetic emissions will also continue to increase, thereby making it more difficult to protect these integrated circuits from the electromagnetic radiation generated by these high frequency processes.

However, with the increase of these unwanted EMI events came the advent of the electromagnetic interference shield by the electronics industry. Generally, an electromagnetic shielding system can limit the penetration of electromagnetic fields into a space, by blocking them with a barrier made of conductive material. Conventionally, this electromagnetic shielding system was placed around the integrated circuit after the integrated circuit was mounted to a larger substrate, such as a printed circuit board. However, fabricating such a metallic enclosure and separately attaching the metallic enclosure to the printed circuit board or to separately formed vertical interconnects is relatively cumbersome, complex, and costly.

Thus, a need still remains for a reliable integrated circuit packaging system and method of fabrication, wherein the integrated circuit packaging system provides a simplified process flow that is more robust for forming vertical interconnects and an electromagnetic interference shield. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting a first integrated circuit over the substrate; forming an encapsulant around the first integrated circuit and over the substrate; and forming a shield structure within and over the encapsulant while simultaneously forming a vertical interconnect structure.

The present invention provides an integrated circuit packaging system, including: a substrate; a first integrated circuit over the substrate; an encapsulant around the first integrated circuit and over the substrate with openings that expose a ground ring pad and a conductive pad; and a shield within and over the encapsulant in contact with the ground ring pad and a vertical interconnect within the encapsulant in contact with the conductive pad.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
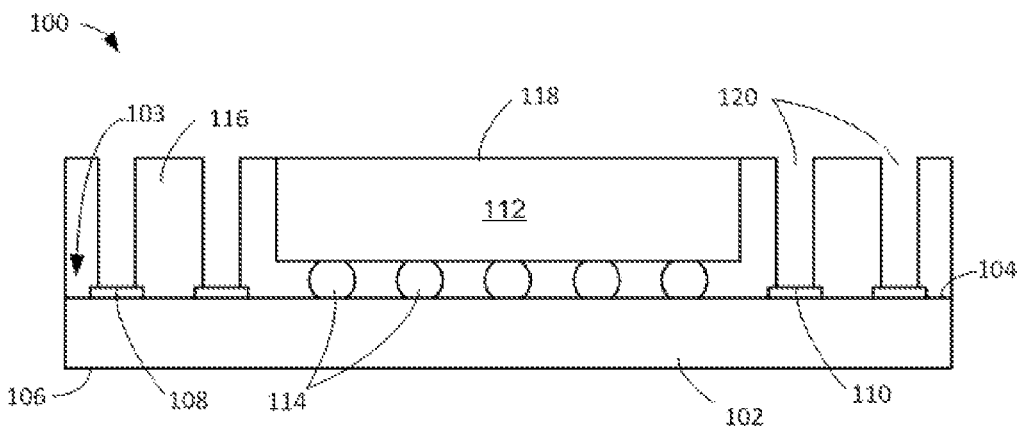
FIG. 1 is a cross sectional view of an integrated circuit packaging system along a line segment 1-1 of FIG. 2 in a stage of manufacture in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is used herein to mean there is direct contact between elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

The terms "simultaneous" or "simultaneously" are used herein to mean occurring at the same time.

Objects described herein as being "adjacent" each other may be in close proximity to each other, e.g., separated only by the minimum distance required by the current technology node, or in the same general region or area as each other, as appropriate for the context in which the phrase is used.

FIGS. 1-9, which follow, depict by way of example and not by limitation, exemplary embodiments for the formation of an integrated circuit packaging system and they are not to be construed as limiting. It is to be understood that a plurality of conventional processes that are well known within the art and not repeated herein, may precede or follow FIGS. 1-9. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit packaging system of the present disclosure may include any number of integrated circuit devices or packages, such as but not limited to, memory circuits, logic circuits, analog circuits, digital circuits, passive circuits, RF circuits, or a combination thereof, for example. Moreover, it is to be understood that the integrated circuit packaging system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof, in numerous configurations and arrangements as may be needed.

Furthermore, it is to be understood that one or more of the integrated circuit packaging system could be prepared at one time on a medium, which could be separated into individual or multiple integrated circuit package assemblies at a later stage of fabrication.

It should be understood that the definitions and nomenclature used herein are given by way of example only and that one skilled in the art would readily understand that other definitions and nomenclature may be used to illustrate the techniques, systems, devices, and methods described herein.

Figure 2:
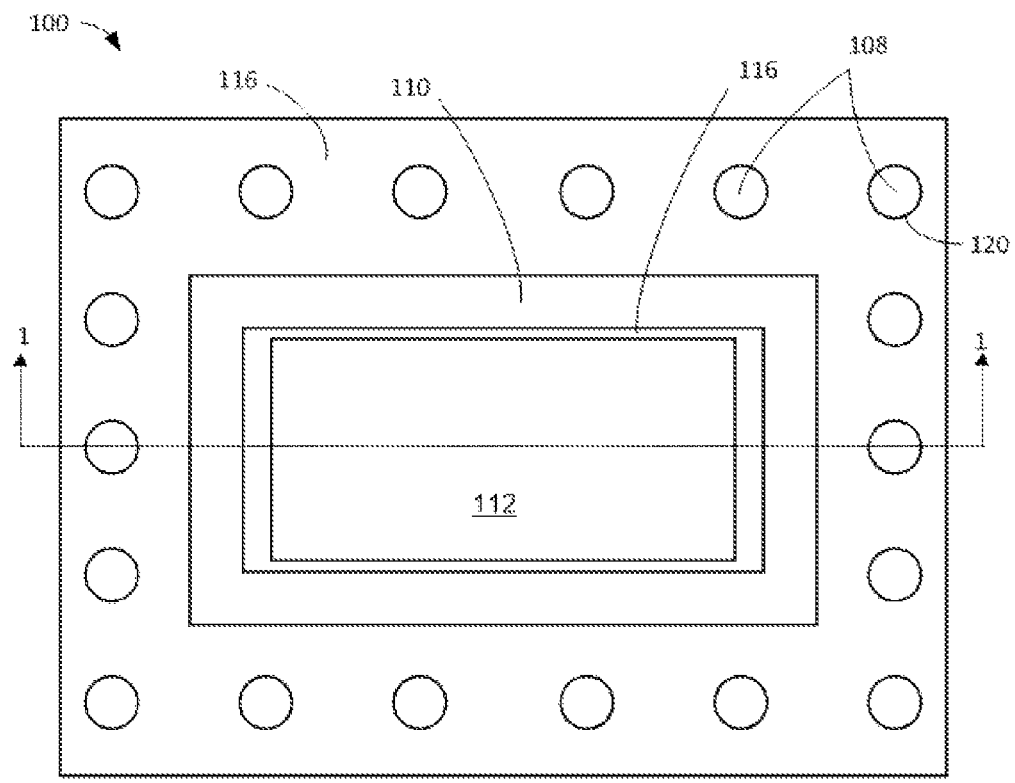
FIG. 2 is a plan view of the integrated circuit packaging system, of FIG. 1.

Referring now to FIG. 1, therein is shown a cross sectional view of an integrated circuit packaging system along a line segment 1-1 of FIG. 2 in a stage of manufacture in a first embodiment of the present invention. Generally, the integrated circuit packaging system 100 may include a substrate 102, such as a printed circuit board (PCB), a leadframe, a carrier substrate, an interposer, a semiconductor substrate with electrical interconnections, a ceramic substrate, a wafer-level packaging substrate, or a multi-layer structure (e.g., a laminate with one or more conductive layers separated by an insulator) suitable for electrically interconnecting integrated circuit systems formed on or above the substrate 102 to external electrical circuits.

Generally, the substrate 102 may include a first side 104 (e.g., a substrate top surface) within a different plane and opposing a second side 106 (e.g., a substrate bottom surface). Conductive pathways (not shown), which may include a combination of traces, vias, and/or redistribution layers, provide an electrical connection between the first side 104 and the second side 106 of the substrate 102. The conductive pathways terminating at the first side 104 can electrically connect to one or more of a conductive pad 108 or a ground pad 110 formed in a pre-selected pattern to correspond with the electrical connection configuration of an overlying device or shielding layer, respectively. In at least one embodiment, the ground pad 110 can be formed between the conductive pad 108 and a first integrated circuit 112. In yet other embodiments the ground pad 110 can be formed as a continuous or discontinuous ring. In such cases, the ground pad 110 can also be called a ground ring pad.

It will be appreciated by those skilled in the art that the conductive pad 108 can provide an electrical interconnection between electrically conductive elements, while the ground pad 110 can provide a connection to ground, a ground plane, or a common return path for electric current.

In at least one embodiment, the conductive pad 108 and the ground pad 110 can be formed over, on, or directly on the substrate 102. The conductive pad 108 can be formed at a periphery 103 of the substrate 102.

Mounted over and/or directly on the substrate 102 is the first integrated circuit 112. In at least one embodiment, the first integrated circuit 112 can be mounted over or on the first side 104 of the substrate 102 inward of the conductive pad 108 and adjacent and inward of the ground pad 110. The first integrated circuit 112 can be substantially centered over the substrate 102, but is not required to be and may include an offset configuration as well.

Generally, the first integrated circuit 112 may include one or more active devices, passive devices, or a combination thereof, vertically stacked or located within the same plane. By way of example, and not by way of limitation, the first integrated circuit 112 may include one or more semiconductor chips or die that transmit, receive, modulate and/or alter electrical signals, such as stacked devices, modular devices, ASIC devices, memory devices, RF devices, analog devices, or a combination thereof.

In other embodiments, the first integrated circuit 112 may further include, by way of example and not by way of limitation, one or more integrated circuit packages that transmit, receive, modulate and/or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof.

In at least one embodiment, the first integrated circuit 112 includes a flip-chip die electrically attached to the substrate 102 by a solder bump 114, which can also be a solder paste or ball, for example. Accordingly, the embodiments described herein embrace electrically connecting the first integrated circuit 112 to the substrate 102 by all known ball grid array and land grid array contact techniques.

Furthermore, it is to be understood that the first integrated circuit 112 may also include Package-in-Package (PiP) and Package-on-Package (PoP) configurations.

As such, it is to be understood that the first integrated circuit 112 covers a wide range of semiconductor chip and integrated circuit package configurations involving various sizes, dimensions, and functional applications, and the type of chip or package configuration employed should only be limited by the design specifications of the integrated circuit packaging system 100.

Moreover, it will be appreciated by those skilled in the art that the present embodiments permit the testing of the first integrated circuit 112 before adhering it to the substrate 102, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

Formed between the substrate 102 and the first integrated circuit 112 can be an underfill material (not shown). Generally, the underfill material may be chosen to reduce stresses arising from a coefficient of thermal expansion (CTE) mismatch between the substrate 102 and the first integrated circuit 112, as well as, promote adhesion between the substrate 102 and the first integrated circuit 112. It will be appreciated by those skilled in the art that the underfill material can be pre-applied to the substrate 102, to the first integrated circuit 112, and/or applied as a capillary underfill material between a connected configuration of the substrate 102 and the first integrated circuit 112.

Generally, an encapsulant 116 can be formed over and/or on the substrate 102. The encapsulant 116 can also be formed over, on, and/or around the first integrated circuit 112. The methods and material used to form the encapsulant 116 are well known within the art and not repeated herein.

In at least one embodiment, the encapsulant 116 does not cover a top surface 118 of the first integrated circuit 112 (i.e., the backside can be exposed to the external environment). In another embodiment, the encapsulant 116 can cover a top surface 118 of the first integrated circuit 112.

Openings 120 can be formed within the encapsulant 116 to expose one or more of the conductive pad 108 and the ground pad 110. In at least one embodiment, the openings 120 can be formed by wet or dry etching techniques. In another embodiment, the openings 120 can be formed by laser drilling. However, it is to be understood that the method of forming the openings 120 is not limited to the preceding examples and may include any etching process. It will be appreciated by those skilled in the art that a masking layer (not shown) can be formed over the integrated circuit packaging system 100 during the formation of the openings 120 to protect the underlying structures.

Generally, the openings 120 can be formed larger, smaller or substantially the same size as the conductive pad 108 or the ground pad 110.

Additionally, although the current embodiment depicts two of the openings 120 on either side of the first integrated circuit 112, it is to be understood that the integrated circuit packaging system 100 may include any number of the openings 120 as required by the design specifications of the integrated circuit packaging system 100.

Furthermore, it will be appreciated by those skilled in the art that a thermal interface material may be provided over a top surface 118 of the first integrated circuit 112 to enhance thermal dissipation if so desired or required by the design specifications of the integrated circuit packaging system 100.

Referring now to FIG. 2, therein is shown a plan view of the integrated circuit packaging system 100, of FIG. 1. The integrated circuit packaging system 100 includes the conductive pad 108, the ground pad 110, the first integrated circuit 112, the encapsulant 116, and the openings 120.

In at least one embodiment, the openings 120 exposing the ground pad 110 can be formed as a continuous and uninterrupted recess within the encapsulant 116 that exposes the ground pad 110, which can be formed as a continuous and uninterrupted ground ring around the first integrated circuit 112. Generally, opposing sides of the openings 120 and the ground pad 110 can be configured to exceed a length of the corresponding sides of the first integrated circuit 112. However, it is to be understood that the length of the openings 120 and the ground pad 110 are not to be limited to the preceding examples and may include any length less than, equal to, or in excess of the corresponding side length dimension of the first integrated circuit 112.

Generally, the openings 120 that expose the ground pad 110 are formed in such a manner so as to permit a subsequent deposition step to encapsulate the first integrated circuit 112 within a cavity formed by the subsequently deposited material. In such cases, it will be appreciated by those skilled in the art that the openings 120 exposing the ground pad 110 and the subsequent deposition of a material within the openings 120 can permit the formation of an electromagnetic interference shield.

The openings 120 exposing the conductive pad 108 can be of substantially similar size and shape as the conductive pad 108; however, differing sizes and shapes between the openings 120 and the conductive pad 108 are permitted.

Additionally, it is to be understood that the number, size, shape, orientation, and/or configuration of the conductive pad 108 and the ground pad 110 depicted is exemplary. For example, the conductive pad 108 and the ground pad 110 may include any number of curvilinear or rectilinear shapes with or without uniform densities or configurations.

Figure 3:
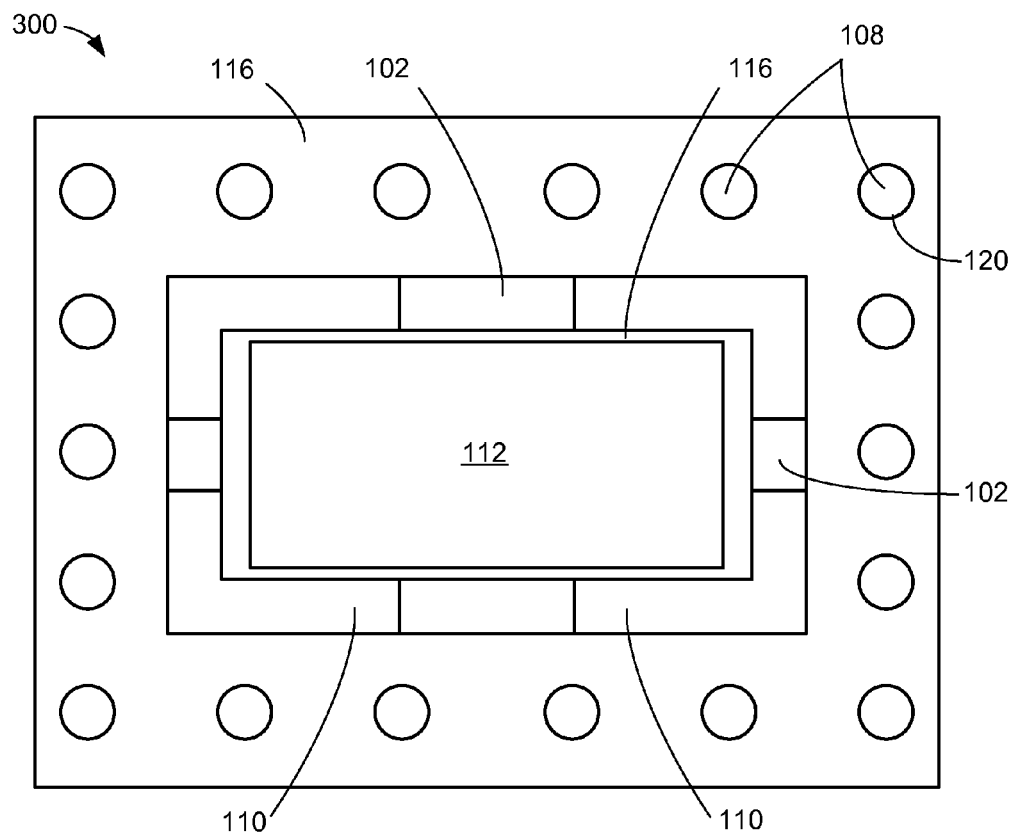
FIG. 3 is a plan view of an integrated circuit packaging system in a second embodiment of the present invention.

Referring now to FIG. 3, therein is shown a plan view of an integrated circuit packaging system 300 in a second embodiment of the present invention. The integrated circuit packaging system 300 includes the substrate 102, the conductive pad 108, the ground pad 110, the first integrated circuit 112, the encapsulant 116, and the openings 120.

In at least one embodiment, the openings 120 exposing the ground pad 110 can be formed as a continuous and uninterrupted recess within the encapsulant 116 that exposes the ground pad 110, which can be formed as a non-continuous/discontinuous and interrupted ground ring around the first integrated circuit 112. In such cases, the ground pad 110 can be comprised by two or more separate and discrete sections separated by the substrate 102, for example. Consequently, the openings 120 that expose the ground pad 110 may also expose the substrate 102.

Generally, the openings 120 that expose the ground pad 110 are formed in such a manner so as to permit a subsequent deposition step to encapsulate the first integrated circuit 112 within a cavity formed by the subsequently deposited material. In such cases, it will be appreciated by those skilled in the art that the openings 120 exposing the ground pad 110 and the subsequent deposition of a material within the openings 120 can permit the formation of an electromagnetic interference shield.

The openings 120 exposing the conductive pad 108 can be of substantially similar size and shape as the conductive pad 108; however, differing sizes and shapes between the openings 120 and the conductive pad 108 are permitted.

Additionally, it is to be understood that the number, size, shape, orientation, and/or configuration of the conductive pad 108 and the ground pad 110 depicted is exemplary. For example, the conductive pad 108 and the ground pad 110 may include any number of curvilinear or rectilinear shapes with or without uniform densities or configurations.

Figure 4:
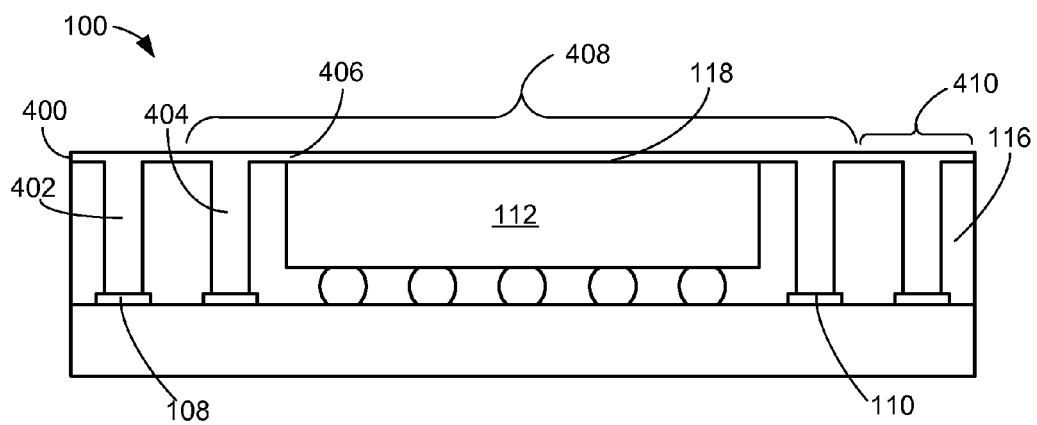
FIG. 4 is a cross sectional view of the integrated circuit packaging system, of FIG. 1 in a stage of manufacture after further processing.

Referring now to FIG. 4, therein is shown a cross sectional view of the integrated circuit packaging system 100, of FIG. 1, in a stage of manufacture after further processing. The integrated circuit packaging system 100 now includes the deposition of a conductive material 400, such as a metal, within the openings 120, of FIG. 1. Generally, the deposition of the conductive material 400 simultaneously forms an electromagnetic interference structure and three dimensional interconnects from the same material (e.g., the conductive material 400). The conductive material 400 can be in direct contact with the conductive pad 108 and the ground pad 110 or in electrical contact with the conductive pad 108 and the ground pad 110 through a low resistance interface, for example. In any case, none of the embodiments disclosed herein form a solder ball or a solder bump between the conductive material 400 and the conductive pad 108 or the ground pad 110. The conductive material 400 forms a conductive post 402, a shield sidewall 404, and a top conductive layer 406.

It is to be understood that the integrated circuit packaging system 100 may undergo a cleaning step to remove surface contaminants, such as particles, mobile ionic contaminants, organics and native oxides, before deposition of the conductive material 400.

It will be appreciated by those skilled in the art that a barrier metal layer may be formed within each of the openings before depositing the conductive material 400 to improve adhesion while minimizing material diffusion problems.

In at least one embodiment, the openings 120 can be filled with the conductive material 400 by electrolytic or electroless plating. Generally, the plating step can be terminated when the level of the conductive material 400 reaches a sufficient height above the encapsulant 116 to form the top conductive layer 406 with an appropriate thickness. It will be appreciated by those skilled in the art that the height or thickness of the conductive material 400 above the encapsulant 116 can depend upon the desired EMI properties of the top conductive layer 406 or as required by the design requirements of the system. When the plating has been completed, the conductive post 402 and the shield sidewall 404 are in contact (e.g., direct contact or electrical contact) with the conductive pad 108 and the ground pad 110, respectively.

It will be appreciated by those skilled in the art that the plating step or process can be performed in one or more plating steps utilizing one or more conductive type materials.

In other embodiments, the conductive material 400 can be deposited by chemical vapor deposition (CVD) or physical vapor deposition (PVD) processes. For example, the conductive material 400 could be deposited by a CVD process utilizing a titanium/titanium nitride barrier layer with a tungsten fill. In such cases, the tungsten nucleation deposition sequence can employ a hydrogen-based plasma treatment to reduce or eliminate fluorine concentration at the tungsten/titanium nitride interface, thereby reducing contact resistance.

In another embodiment, the openings 120 can be filled with the conductive material 400 by squeezing the conductive material 400 into each of the openings 120. Generally, this process employs an implement to apply a force to the conductive material 400, thereby exerting enough pressure upon the conductive material 400 to form the conductive post 402 in contact (e.g., direct or electrical) with the conductive pad 108 and the shield sidewall 404 in contact (e.g., direct or electrical) with the ground pad 110.

Figure 5:
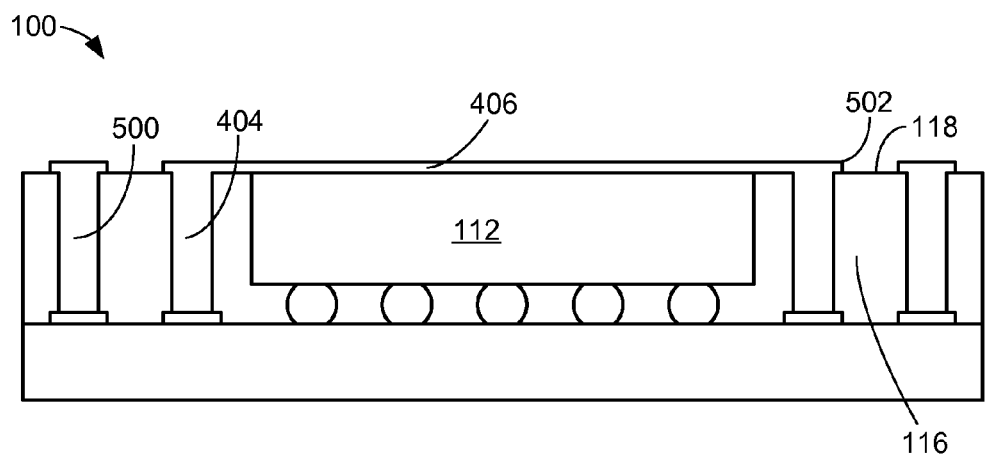
FIG. 5 is a cross sectional view of the integrated circuit packaging system, of FIG. 4, in a stage of manufacture after further processing along a line segment 5-5 of FIG. 6.

As an exemplary illustration, the conductive material 400 may include a type of gel-type B-stage conductive material that can be cured by heating after a printing process. In one embodiment, a stencil mask can be placed on the top surface 118 of the integrated circuit packaging system 100 to block the B-stage conductive material such that each of a vertical interconnect 500, of FIG. 5, are not interconnected to one another and/or to a shield 502, of FIG. 5. The conductive material 400 can be squeezed on the stencil mask, thereby filling the openings 120 and constructing the conductive post 402, the shield sidewall 404, and the top conductive layer 406, after which the stencil mask can be removed.

This process can be described as simultaneous because the shield 502 and the vertical interconnect 500 can be formed as separate and discrete structures at the same time by utilizing a mask. Such a simultaneous process can save cost and simplify the process flow compared to attaching a separate EMI shield in a subsequent process after forming the vertical interconnects.

In yet other embodiments, the stencil mask need not be used and the conductive material 400 can be manipulated to form the top conductive layer 406 over all or part of the top surface 118 of the integrated circuit packaging system 100 and into each of the openings 120.

In yet another embodiment, the conductive material 400 can be deposited by solder techniques well known in the art and not repeated herein.

It will be appreciated by those skilled in the art that the deposition processes that form the top conductive layer 406 permit the simultaneous formation of a shield structure 408 (e.g., the portion of the conductive material 400 formed over and around the first integrated circuit 112 including the top conductive layer 406) and one or more of a vertical interconnect structure 410 (e.g., the portion of the conductive material 400 formed over the conductive pad 108 including the top conductive layer 406) that permits electrically interconnected three dimensional (3D) stacking of devices and/or packages. The shield structure 408 is formed as a continuous structure by deposition as described above. This process can be described as simultaneous because the shield structure 408 and the vertical interconnect structure 410 can be formed at the same time. Such a simultaneous process can save cost and simplify the process flow compared to attaching a separate EMI shield in a subsequent process after forming the vertical interconnects.

In at least one embodiment, the first integrated circuit 112 is encapsulated or completely surrounded by the conductive material 400, thereby optimizing the EMI shielding capability of the shield 502. Additionally, the thermal performance of the integrated circuit packaging system 100 may also be improved because the heat can be dissipated towards the shield 502.

Figure 6:
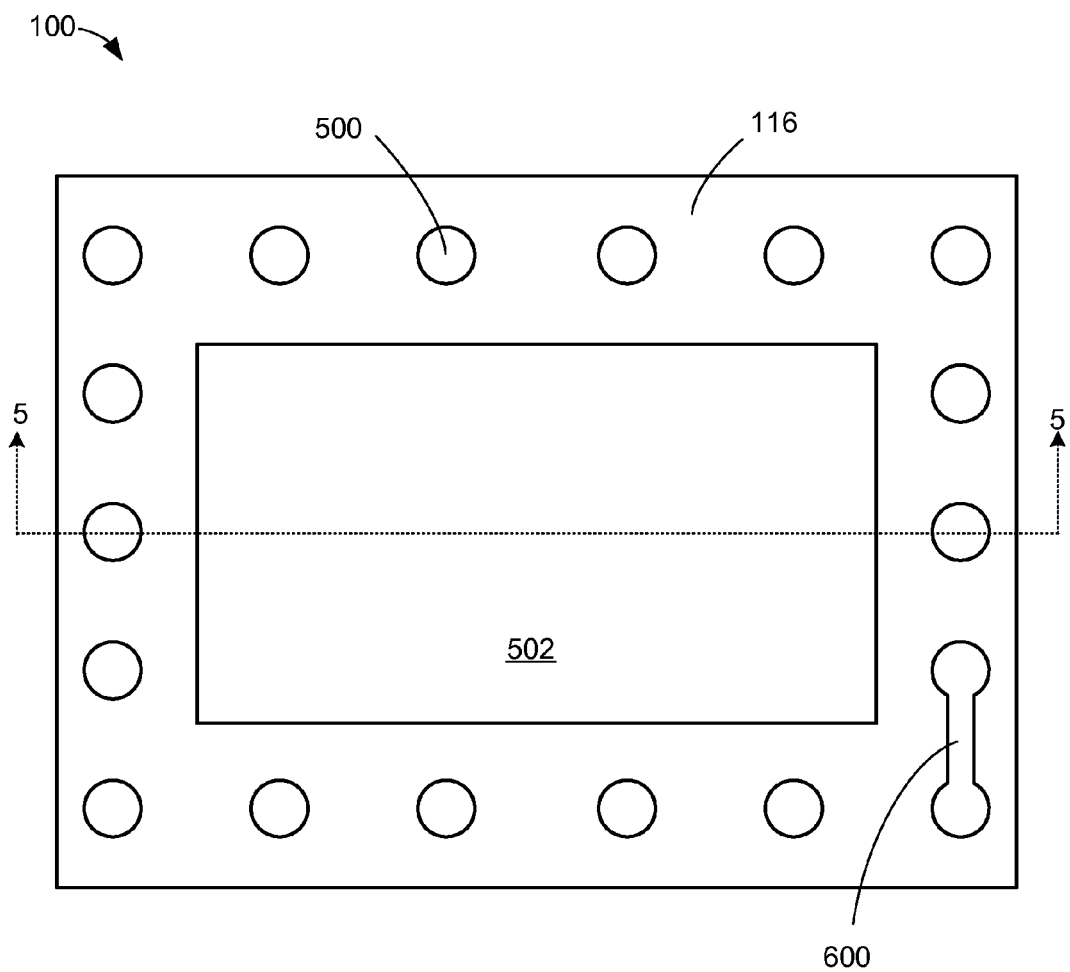
FIG. 6 is a plan view of the integrated circuit packaging system, of FIG. 5.

Referring now to FIG. 5, therein is shown a cross sectional view of the integrated circuit packaging system 100, of FIG. 4, in a stage of manufacture after further processing along a line segment 5-5 of FIG. 6. The integrated circuit packaging system 100 now includes the vertical interconnect 500 and the shield 502, such as an electromagnetic shield or an EMI shield. It will be appreciated by those skilled in the art that an electromagnetic shield or an EMI shield limits the penetration of electromagnetic fields into a space, by blocking them with a barrier made from the conductive material 400, of FIG. 4.

Generally, the shield 502 can be formed over and/or around the first integrated circuit 112 and may include the shield sidewall 404 and the top conductive layer 406.

As mentioned previously, the top conductive layer 406 can be formed over all or part of the integrated circuit packaging system 100 if a masking layer is not used. In such cases, the top conductive layer 406 may require some patterning to produce the desired structures. In at least one embodiment, the top conductive layer 406 can be patterned by etching, e.g., subtractive etching, to produce the vertical interconnect 500 and the shield 502. It will be appreciated by those skilled in the art that the patterning of the top conductive layer 406 will separate the vertical interconnect 500 and the shield 502 physically and electrically. As such, the top surface 118 of the encapsulant 116 can be exposed between the vertical interconnect 500 and the shield 502.

Generally, the vertical interconnect 500 can be described as an electrically conductive post formed from the conductive material 400. However, in no instance is the vertical interconnect 500 formed as a wire bond interconnect or a solder ball/bump interconnect.

Referring now to FIG. 6, therein is shown a plan view of the integrated circuit packaging system 100, of FIG. 5. The integrated circuit packaging system 100 may include the encapsulant 116, the vertical interconnect 500, the shield 502, and a redistribution layer 600. The redistribution layer 600 is optional and can be formed between two or more of the vertical interconnect 500.

Figure 7:
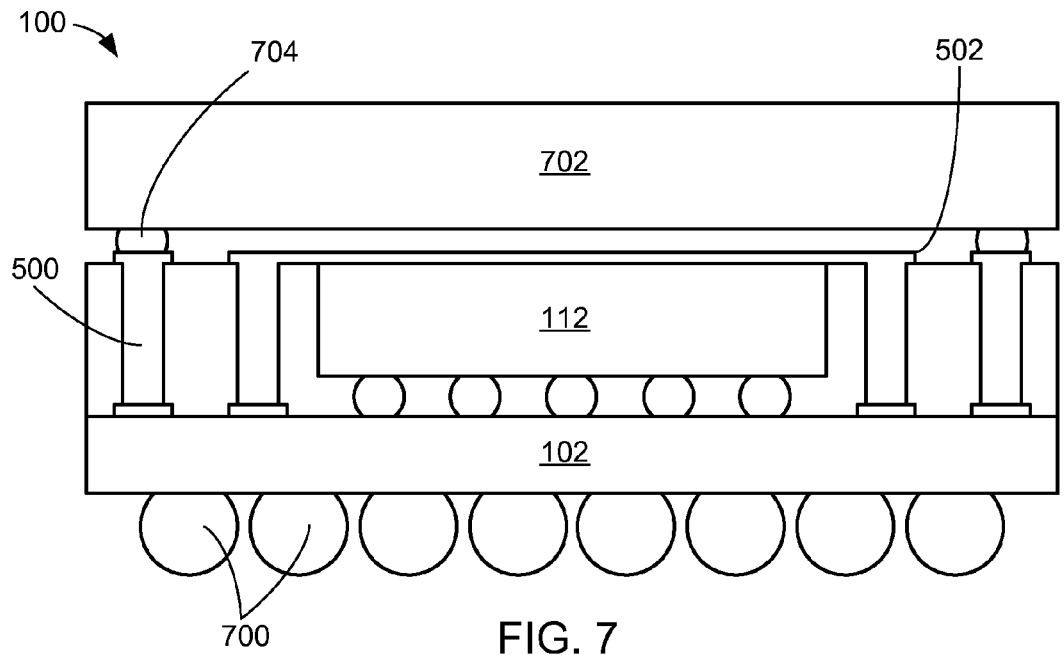
FIG. 7 is a cross sectional view of the integrated circuit packaging system, of FIG. 5, after further processing.

Referring now to FIG. 7, therein is shown a cross sectional view of the integrated circuit packaging system 100, of FIG. 5, after further processing. The integrated circuit packaging system 100 now includes external interconnects 700, a second integrated circuit 702, and an interconnect 704.

The external interconnects 700 may provide further electrical connections to external electrical circuits, such as additional packages or printed circuit boards, for example. It will be appreciated by those skilled in the art that the external interconnects 700 may include solder balls formed as part of a ball grid array structure. Although the present embodiment depicts the external interconnects 700 as solder balls, it is to be understood that the external interconnects 700 may include any interface connection technology, such as a pin or land grid array that establishes electrical contact between the integrated circuit packaging system 100 and external electrical circuits.

Formed over the first integrated circuit 112 is the second integrated circuit 702. The second integrated circuit 702 can be attached to the vertical interconnect 500 by the interconnect 704. Generally, the interconnect 704 can be a solder ball but may include other connections well known in the art and not repeated herein. The second integrated circuit 702 can be substantially centered over the substrate 102, but is not required to be and may include an offset configuration as well.

In at least one embodiment, a thermal interface material can be formed between the shield 502 and the second integrated circuit 702 to enhance thermal dissipation from the integrated circuit packaging system 100.

Generally, the second integrated circuit 702 may include one or more active devices, passive devices, or a combination thereof, vertically stacked or located within the same plane. By way of example, and not by way of limitation, the second integrated circuit 702 may include one or more semiconductor chips or die that transmit, receive, modulate and/or alter electrical signals, such as stacked devices, modular devices, ASIC devices, memory devices, RF devices, analog devices or a combination thereof. In other embodiments, the second integrated circuit 702 may further include, by way of example and not by way of limitation, one or more integrated circuit packages that transmit, receive, modulate and/or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof.

In at least one embodiment, the second integrated circuit 702 may include a flip-chip die electrically attached to the vertical interconnect 500 by the interconnect 704. Accordingly, the current embodiment embraces electrically connecting the second integrated circuit 702 to the vertical interconnect 500 by all known ball grid array and land grid array contact techniques.

Furthermore, it is to be understood that the second integrated circuit 702 may also include Package-in-Package (PiP) and Package-on-Package (PoP) configurations.

As such, it is to be understood that the second integrated circuit 702 covers a wide range of semiconductor chip and integrated circuit package configurations involving various sizes, dimensions, and functional applications, and the type of chip or package configuration employed should only be limited by the design specifications of the integrated circuit packaging system 100.

Moreover, it will be appreciated by those skilled in the art that the present embodiments permit the testing of the second integrated circuit 702 before adhering it to the vertical interconnect 500, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

Figure 8:
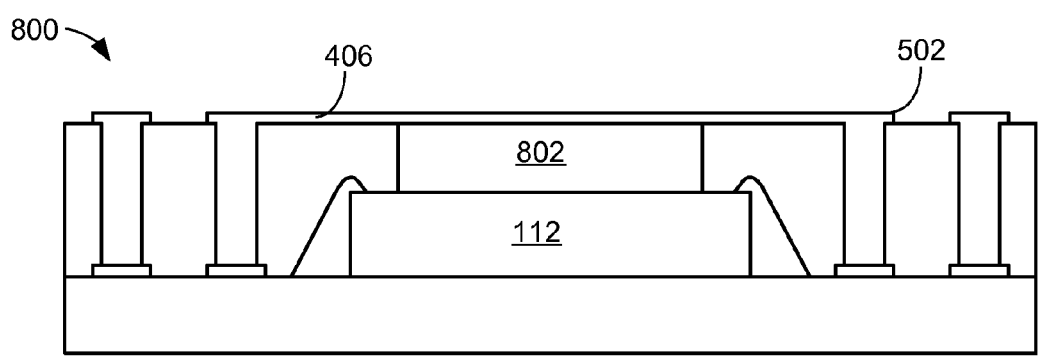
FIG. 8 is a cross sectional view of an integrated circuit packaging system in a third embodiment of the present invention.
Figure 9:
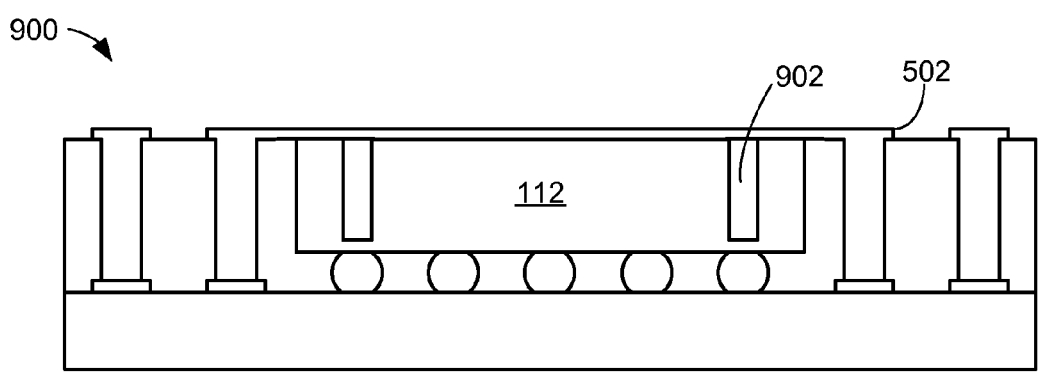
FIG. 9 is a cross sectional view of an integrated circuit packaging system in a fourth embodiment of the present invention.

Referring now to FIGS. 8 and 9. FIGS. 8 and 9 include some of the same reference numbers used to describe the integrated circuit packaging system 100 in FIGS. 1-7 and the process steps of FIGS. 1-7. It is noted that the layers, structures, and process steps corresponding to such reference numbers generally include the same characteristics (e.g., composition, thickness, function, process techniques, etc.) as those described in reference to FIGS. 1-7 and, therefore, their descriptions are not reiterated in detail for FIGS. 8 and 9. Rather the descriptions of the layers, structures, and process steps corresponding to reference numbers in FIGS. 1-7 are incorporated for the same reference numbers included in FIGS. 8 *and* 9.

It is to be understood that FIGS. 8 and 9 depict, by way of example and not by limitation, additional configurations and/or structures that can be employed for the integrated circuit packaging system 100 of FIGS. 1-7.

Referring now to FIG. 8, therein is shown a cross sectional view of an integrated circuit packaging system 800 in a third embodiment of the present invention. Per this embodiment, the first integrated circuit 112 may also include a wire-bonded die or an internal stacking module, wherein the active side of the first integrated circuit 112 may include a space for receiving a protrusion 802 from the shield 502. In at least one embodiment, the protrusion 802 can directly contact the active side of the first integrated circuit 112. In another embodiment, the protrusion 802 does not contact the active side of the first integrated circuit 112. In either case, a thermal interface material, an encapsulation material and/or a passivation layer may also be formed between the active side of the first integrated circuit 112 and the protrusion 802 emanating downward from the top conductive layer 406 of the shield 502. It will be appreciated by those skilled in the art that the thermal interface material, the encapsulation material, and/or the passivation layer can be designed to help prevent signal interference and thus maintain integrity of the system.

Referring now to FIG. 9, therein is shown a cross sectional view of an integrated circuit packaging system 900 in a fourth embodiment of the present invention. Per this embodiment, the first integrated circuit 112 may include one or more of a via 902 formed within the first integrated circuit 112 that is physically and/or thermally connected to the shield 502. Generally, the via 902 may include a silicon material or other thermally conductive materials. However, it is to be understood that the type of material chosen is not critical, what is important is that the via 902 permit the transference of heat from the first integrated circuit 112 to the shield 502. In at least one embodiment, one or more of the via 902 can be located within hot spots of the first integrated circuit 112, thereby enhancing the thermal dissipation of heat from the first integrated circuit 112.

It will be appreciated by those skilled in the art that the via 902 could be formed by a dummy through silicon via process. In such cases, the via 902 could be part of a through silicon via chip or package.

Figure 10:
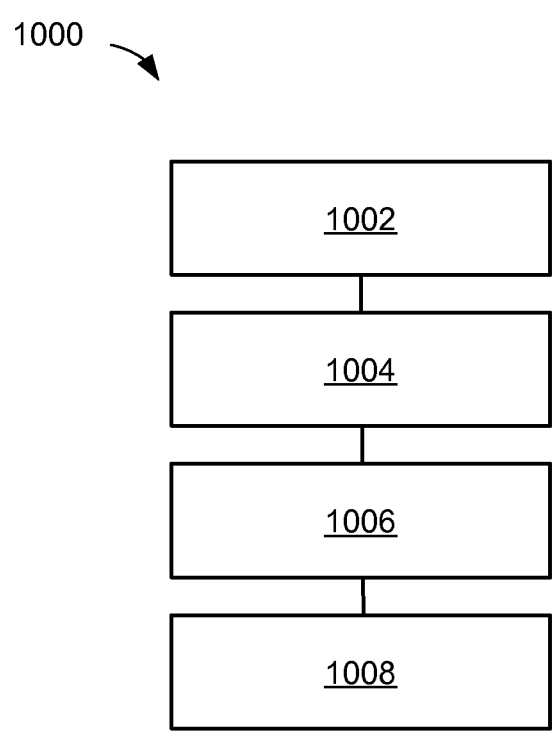
FIG. 10 is a flow chart of a method of manufacture of an integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: providing a substrate in a block 1002; mounting a first integrated circuit over the substrate in a block 1004; forming an encapsulant around the first integrated circuit and over the substrate in a block 1006; and forming a shield structure within and over the encapsulant while simultaneously forming a vertical interconnect structure in a block 1008.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the current embodiments of masking, etching, and then simultaneously filling the openings within the encapsulant with a conductive material provides a relatively more robust method of manufacture than conventional methods of forming solder balls, reflowing the solder balls, exposing them from within an encapsulant and then affixing a shield to the solder bumps in a separate subsequent process step.

Another aspect of the present invention is that the simultaneous formation of the shield and the vertical interconnect simplifies the process flow compared to attaching an EMI shielding plate in a separate step.

Another aspect of the present invention is that the integrated circuit is fully covered by the shield, thereby optimizing the EMI shielding capability of the integrated circuit packaging system.

Another aspect of the present invention is that the thermal performance of the integrated circuit packaging system can be improved because the heat of the system can be dissipated towards the shield, which may also act as a heat sink.

Another aspect of the present invention is that both the manufacturing time and cost can be reduced because the number of manufacturing steps is reduced over that of conventional methods.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   mounting a first integrated circuit over the substrate;
   forming a ground ring pad on a first side of the substrate and adjacent to the first integrated circuit;
   forming a conductive pad on a periphery of the substrate, the ground ring pad between the conductive pad and the first integrated circuit;
   forming an encapsulant around the first integrated circuit and over the substrate; and
   forming a shield structure within and over the encapsulant while simultaneously forming a vertical interconnect structure, the shield structure in direct contact with the first integrated circuit and the shield structure is a continuous structure characteristic of a deposition process.

2. The method as claimed in claim 1 wherein:
   forming the shield structure includes forming a protrusion.

3. The method as claimed in claim 1 wherein:
   forming the ground pad continuously around the first integrated circuit and contacting the shield structure.

4. The method as claimed in claim 1 further comprising:
   forming a via within the first integrated circuit for dissipating heat to the shield structure.

5. The method as claimed in claim 1 further comprising:
   stacking a second integrated circuit over the first integrated circuit.

6. A method of manufacture of an integrated circuit packaging system comprising:
   providing a substrate;
   mounting a first integrated circuit over the substrate;
   forming a ground ring pad on a first side of the substrate and adjacent to the first integrated circuit;
   forming a conductive pad on a periphery of the substrate, the ground ring pad between the conductive pad and the first integrated circuit;
   forming an encapsulant around the first integrated circuit and over the substrate with openings;

forming a shield structure within and over the encapsulant while simultaneously forming a vertical interconnect structure, the shield structure in direct contact with the first integrated circuit and the shield structure is a continuous structure characteristic of a deposition process; and patterning the shield structure and the vertical interconnect structure to form a shield and a vertical interconnect.

7. The method as claimed in claim 6 wherein:
forming the ground pad non-continuously around the first integrated circuit and contacting the shield.

8. The method as claimed in claim 6 further comprising:
forming a redistribution layer between two of the vertical interconnects.

9. The method as claimed in claim 6 wherein:
forming the shield includes forming an electromagnetic interference shield.

10. The method as claimed in claim 6 wherein:
mounting the first integrated circuit includes forming a flip-chip device or a wire-bonded device.

11. An integrated circuit packaging system comprising:
a substrate;
a first integrated circuit over the substrate;
a ground ring pad on a first side of the substrate and adjacent to the first integrated circuit;
a conductive pad on a periphery of the substrate, the ground ring pad between the conductive pad and the first integrated circuit;
an encapsulant around the first integrated circuit and over the substrate with openings that expose the ground ring pad and the conductive pad; and
a shield within and over the encapsulant in contact with the ground ring pad, the shield in direct contact with the first integrated circuit and the shield is a continuous structure characteristic of a deposition process; and
a vertical interconnect within the encapsulant and in contact with the conductive pad.

12. The system as claimed in claim 11 wherein:
the shield includes a protrusion.

13. The system as claimed in claim 11 wherein:
the ground ring pad is configured continuously around the first integrated circuit.

14. The system as claimed in claim 11 further comprising:
a via within the first integrated circuit for dissipating heat to the shield.

15. The system as claimed in claim 11 wherein:
the ground ring pad is configured discontinuously around the first integrated circuit.

16. The system as claimed in claim 11 further comprising:
a second integrated circuit stacked over the first integrated circuit.

17. The system as claimed in claim 16 further comprising:
a redistribution layer between two of the vertical interconnects.

18. The system as claimed in claim 16 wherein:
the shield and the vertical interconnect include the same material.

19. The system as claimed in claim 16 wherein:
the shield includes an electromagnetic interference shield.

20. The system as claimed in claim 16 wherein:
the first integrated circuit includes a flip-chip device or a wire-bonded device.

\* \* \* \* \*